United States Patent [19]
Bell et al.

[11] Patent Number: 5,392,297
[45] Date of Patent: Feb. 21, 1995

[54] METHOD FOR AUTOMATIC ISOLATION OF FUNCTIONAL BLOCKS WITHIN INTEGRATED CIRCUITS

[75] Inventors: Martin J. Bell, Santa Clara; Muhammad A. Samad, San Jose, both of Calif.

[73] Assignee: VLSI Technology, Inc., San Jose, Calif.

[21] Appl. No.: 893,629

[22] Filed: Jun. 5, 1992

Related U.S. Application Data

[63] Continuation-in-part of Ser. No. 824,892, Jan. 22, 1992, abandoned, which is a continuation of Ser. No. 658,415, Feb. 15, 1991, abandoned, which is a continuation of Ser. No. 340,325, Apr. 18, 1989, abandoned.

[51] Int. Cl.[6] .............................................. G01R 31/28
[52] U.S. Cl. .................... 371/22.6; 371/22.1; 371/22.3
[58] Field of Search ................. 324/73.1, 158 R; 371/22.1, 22.3, 22.6

[56] References Cited

U.S. PATENT DOCUMENTS

| | | | |
|---|---|---|---|
| 3,961,254 | 6/1976 | Cavaliere et al. | 371/22.3 |
| 4,404,519 | 9/1983 | Westcott | 324/73.1 X |
| 4,504,784 | 3/1985 | Goel et al. | 371/22.3 |
| 4,546,472 | 10/1985 | Volk et al. | 371/22.6 X |
| 4,555,783 | 11/1985 | Swanson | 371/22.6 |
| 4,602,210 | 7/1986 | Fasang et al. | 371/22.3 |
| 4,698,588 | 10/1987 | Hwang et al. | 371/22.3 |
| 4,701,921 | 10/1987 | Powell et al. | 371/22.3 |
| 4,710,930 | 12/1987 | Hatayama et al. | 371/22.3 |
| 4,752,729 | 6/1988 | Jackson et al. | 371/22.1 X |

OTHER PUBLICATIONS

Samad et al., "A Methodology for the Test of Embedded Compiled Cells", IEEE Custom IC Conference, May 1988, pp. 16.7.1–16.7.3.

Primary Examiner—Emanuel T. Voeltz
Assistant Examiner—Eric W. Stamber
Attorney, Agent, or Firm—Burns, Doane, Swecker & Mathis

[57] ABSTRACT

A system for generating configurations for isolation circuits that can be designed into ASIC chips such that the isolation circuits are transparent during normal operation of the host chip but allow the embedded functional blocks to be readily isolated and accessed for testing via the host chip's pads.

1 Claim, 6 Drawing Sheets

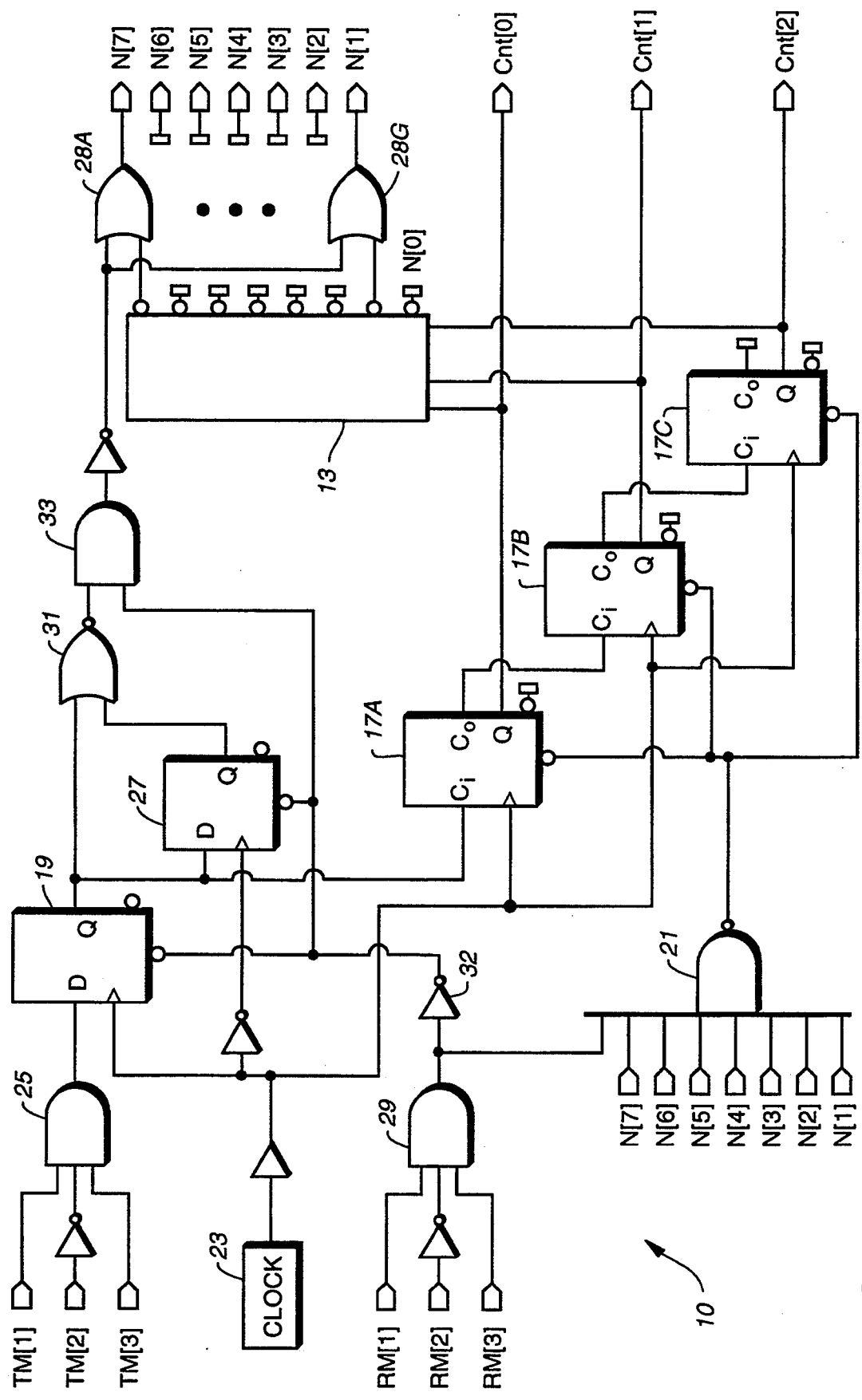
FIG._1

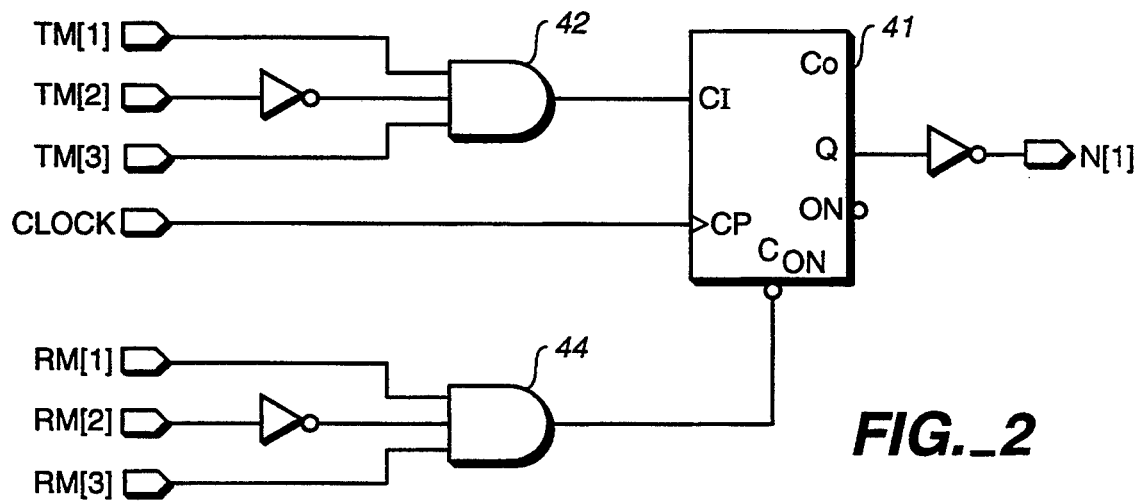
FIG._2
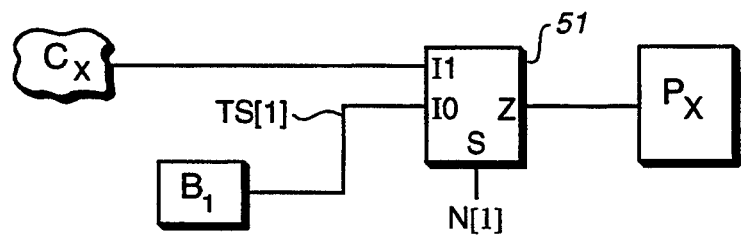
FIG._3
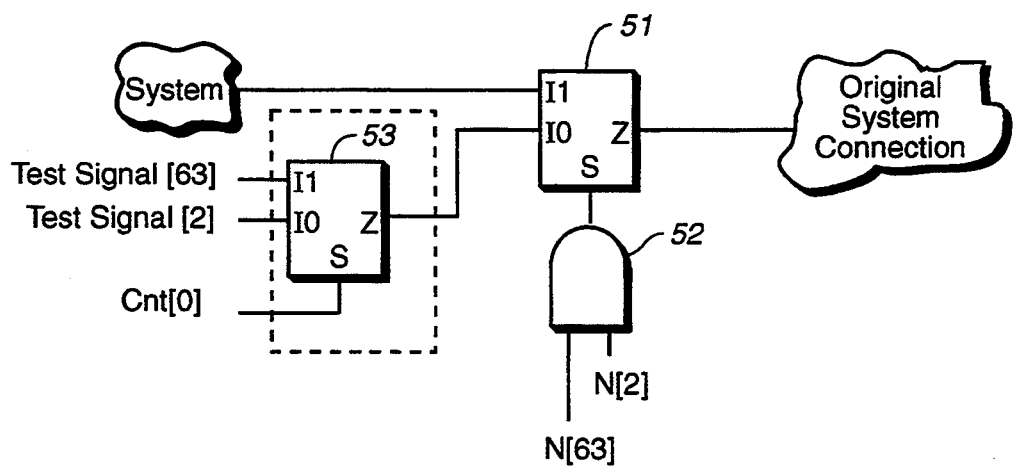
FIG._4A

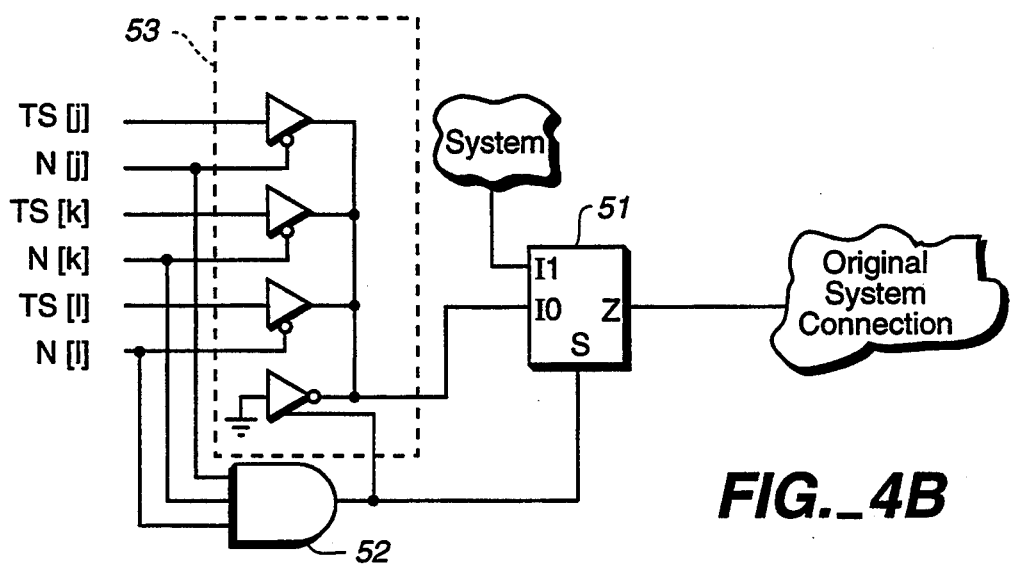
FIG._4B
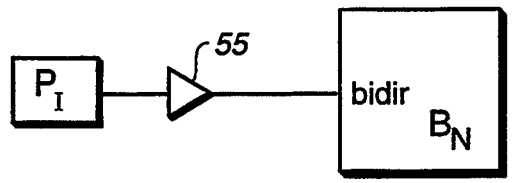
FIG._10A
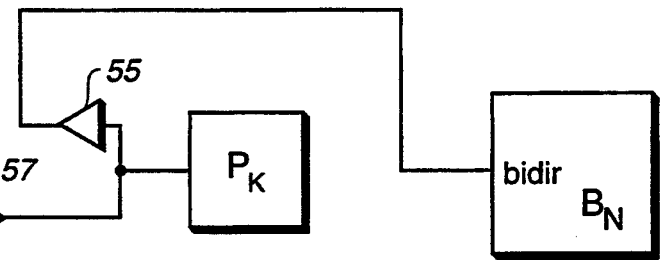
FIG._10B
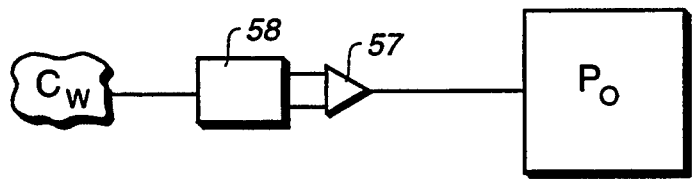
FIG._11A
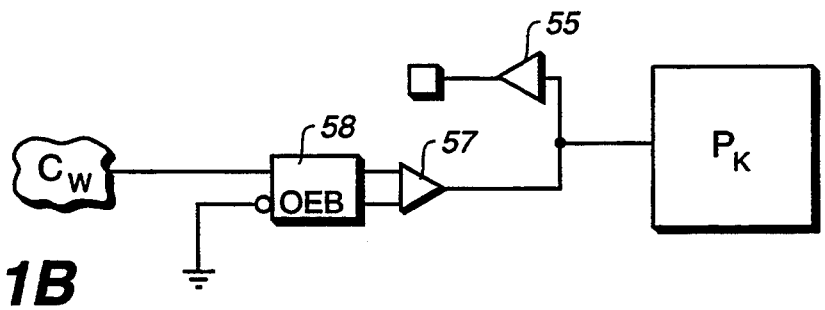
FIG._11B

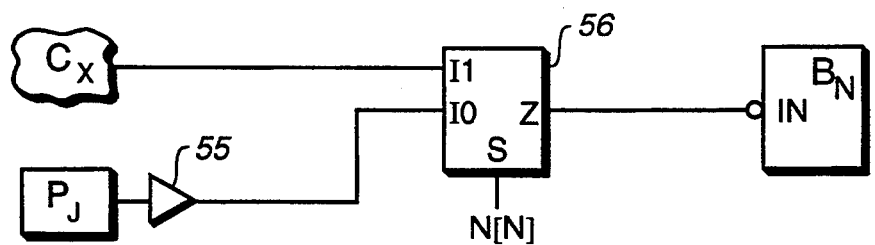
FIG._5
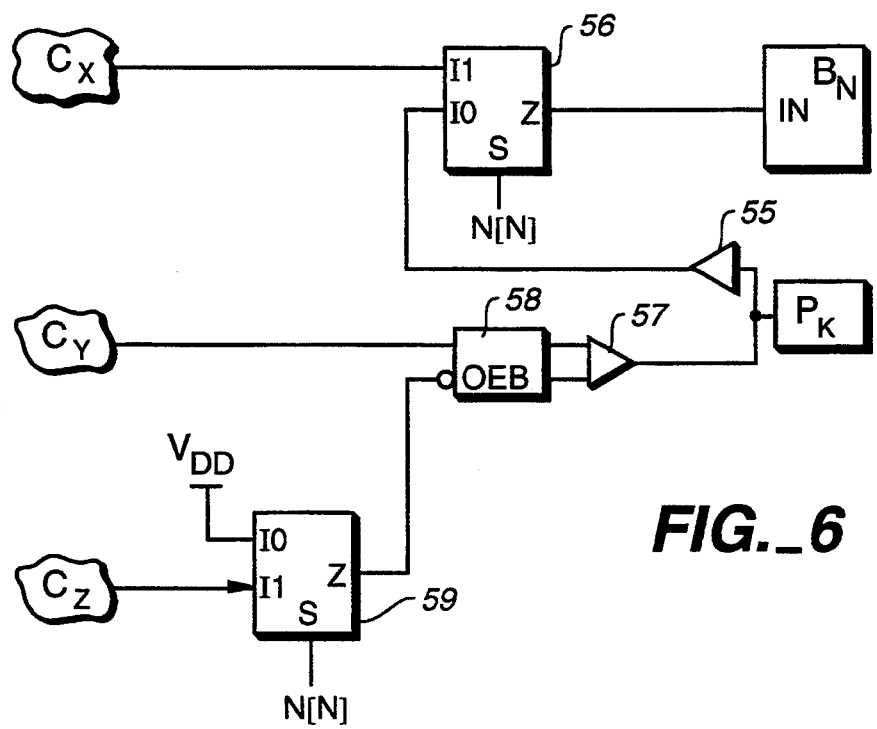
FIG._6
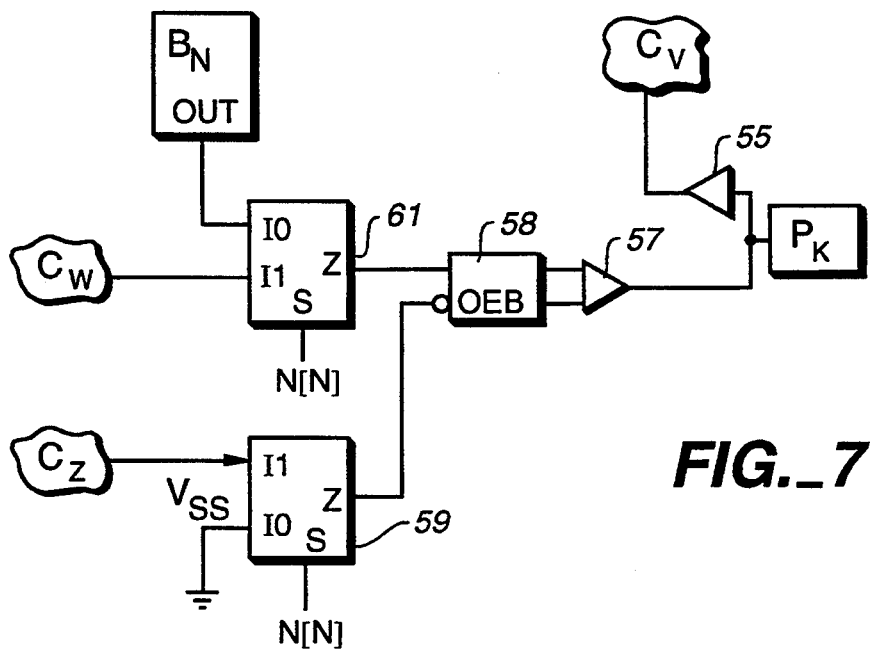
FIG._7

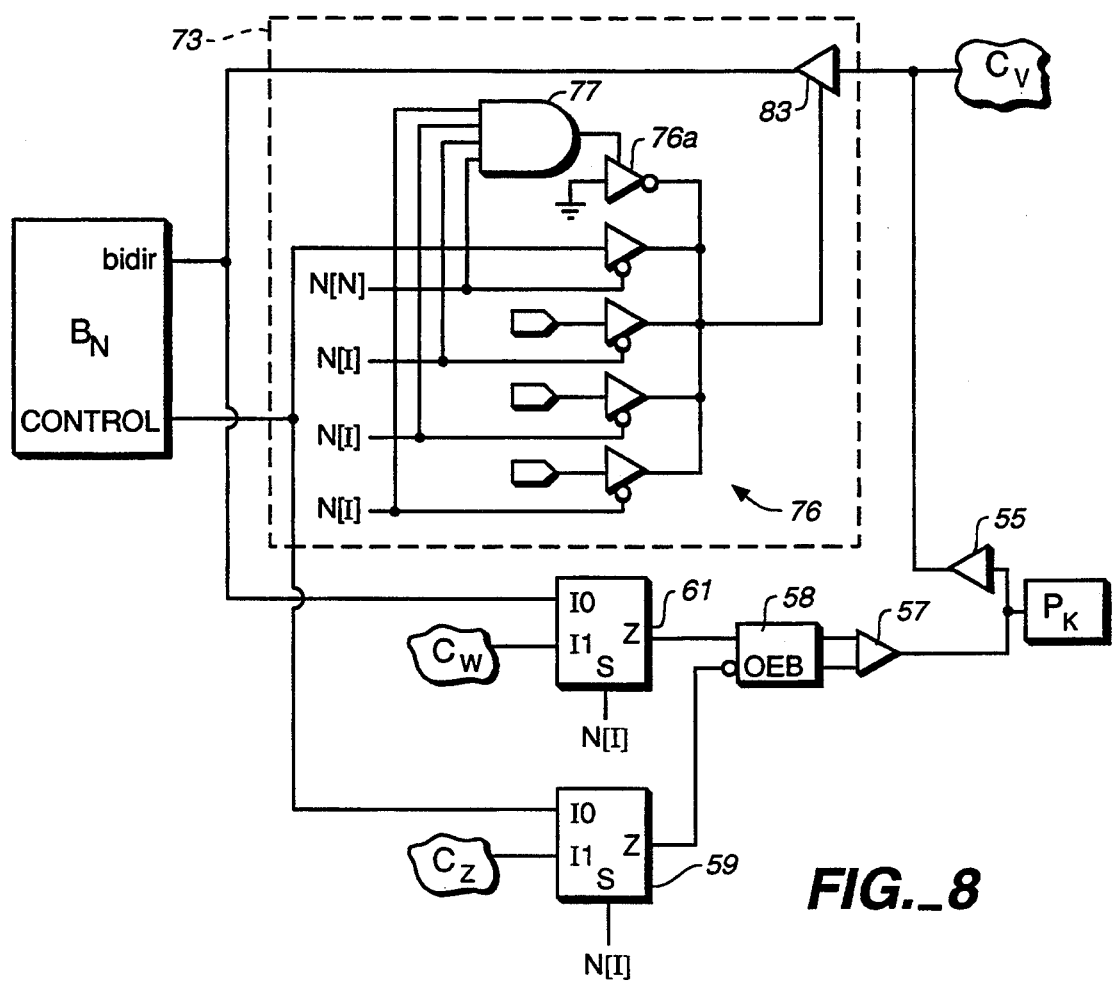
FIG._8
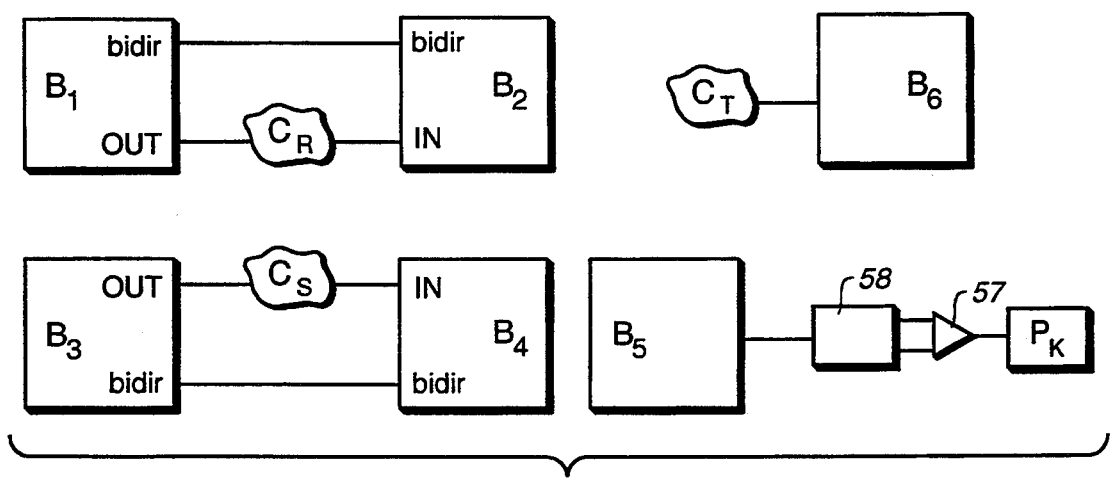
FIG._9A

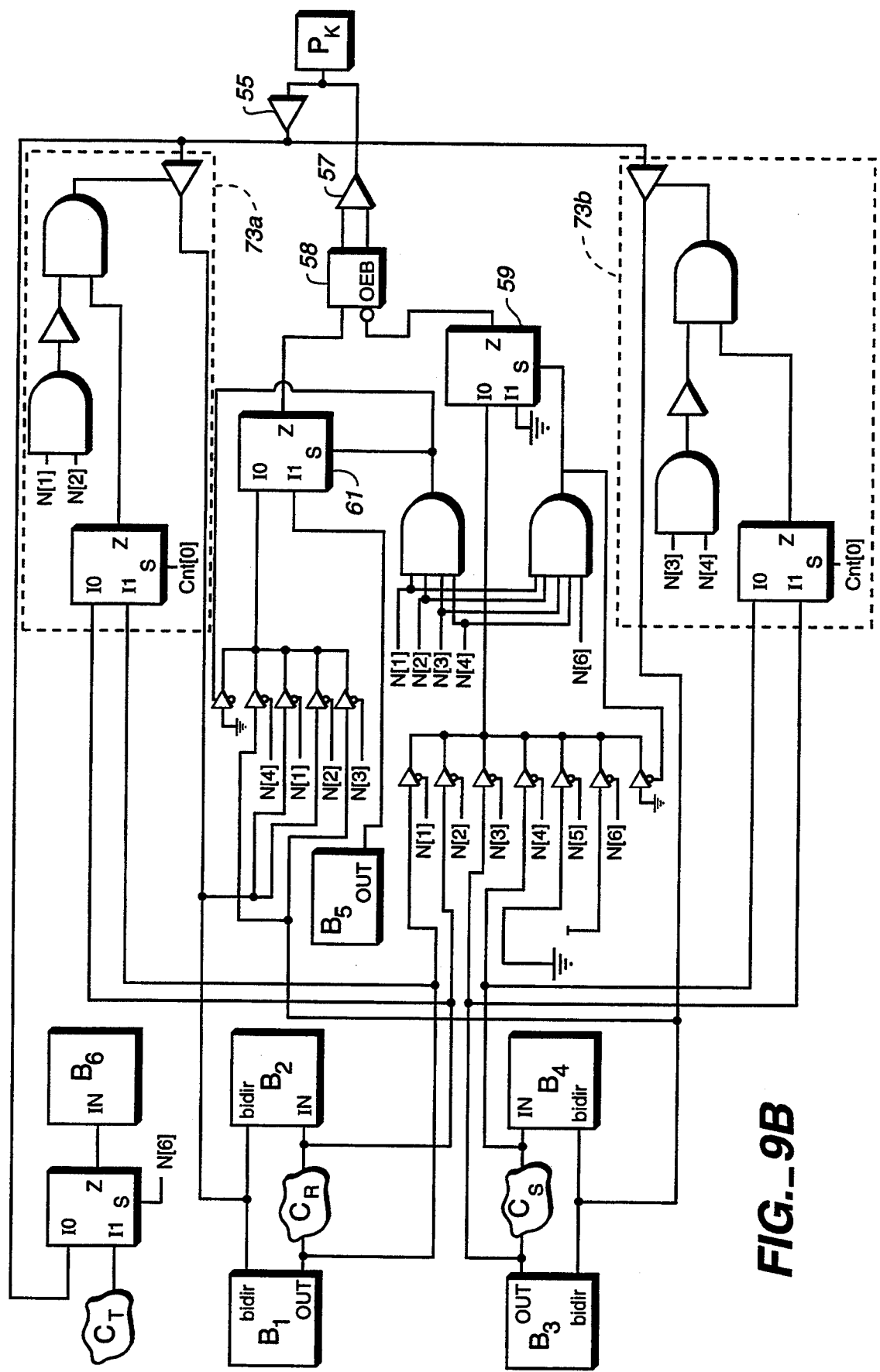
FIG._9B

METHOD FOR AUTOMATIC ISOLATION OF FUNCTIONAL BLOCKS WITHIN INTEGRATED CIRCUITS

RELATED APPLICATION

The present application is a continuation-in-part of co-pending application Ser. No. 07/824,892, filed in the United States Patent and Trademark Office on Jan. 22, 1992, now abandoned, which is a continuation of application Ser. No. 07/658,415, filed in the United States Patent and Trademark Office on Feb. 15, 1991, now abandoned, which is a continuation of application Ser. No. 07/340,325, filed in the United States Patent and Trademark Office on Apr. 18, 1989, now abandoned, all of which are commonly assigned herewith, and the disclosures of which are incorporated herein in their entirety.

BACKGROUND

1. Field of the Invention

The present invention generally relates to the testing of very large-scale integrated circuits and, more particularly, to the testing of such circuits of the type known as application specific integrated circuits (ASICs).

2. State of the Art

In the semiconductor industry, it is commonplace to manufacture integrated circuits or "chips" which each comprise hundreds of thousands, if not millions, of individual circuit components such as transistors. Although testing of such integrated circuits can be a formidable task, it is usually economical to devise routine testing programs when the integrated circuits have a standardized design and are produced in large volumes.

In recent years, technology has developed to economically provide integrated circuits of the type known as application-specific integrated circuits (ASICs). In essence, ASIC chips are custom-designed circuits of the LSI (large scale integration) or VLSI (very large scale integration) class. ASIC chips often include one or more functional blocks which, individually, may be classified as an LSI or VLSI circuit. For instance, the functional blocks within an ASIC chip may comprise one or more random access memories (RAMs), read-only memories (ROMs), state machines, or programmable logic array (PLAs).

ASIC chips are normally characterized by relatively low production volumes. Thus, while ASIC chips and the functional blocks therein require testing to the same degree as standard-design integrated circuit chips, the low production volumes of ASIC chips usually imply that the testing techniques for standard-design chips cannot be used economically for ASIC chips. Moreover, the testing of functional blocks within ASIC chips can be quite complex when the ports of a block cannot be directly accessed from the pads of an ASIC chip. Such difficulties occur, for example, when a functional block is a component of a larger functional block which, itself, is one of many component circuits within a host ASIC chip.

Various methods have been proposed for testing functional blocks that are embedded within ASIC chips. Examples of such methods are discussed in the article "Logic Verification and Production Testing of Non-structured Embedded VLSI Blocks," Breitenwisher, T. G., Proceedings of the 1987 IEEE Custom Integrated Circuits Conference, pp. 62–65.

In practice, the implementation of test procedures for ASIC chips is at least partly manual because individual attention must be paid to isolating the functional blocks and to providing conductors within the chips to allow the functional blocks to be tested via signals which are input to the chip pads. According to conventional design practice, multiplexers often are embedded within ASIC chips for facilitating the testing of functional blocks via selected input/output pads on the chips. Typically, the proper placement and connections for such multiplexers requires the expenditure of substantial time by an experienced engineer.

To test an isolated functional block within an ASIC chip, it is also known to apply test mode vectors to the chip pads. Conceptually, a chip pad and the logic value on it can be thought of as an ordered pair. Therefore, a test mode vector can be defined according to a set of such ordered pairs, where the width of the vector equals the number of ordered pairs that it contains. One method for generating test mode vectors is described in an article by M. Arif Samad and T. Butzerin entitled "A Methodology for the Test of Embedded Compiled Cells," Proceedings of the 1988 IEEE Custom Integrated Circuits Conference, pp. 16.7.1–16.7.3.

SUMMARY OF THE INVENTION

In view of the preceding, it can be appreciated that there exists a need for improved systems for testing functional blocks embedded within integrated circuits such as ASIC chips. The present invention satisfies this need by providing a technique for generating configurations for circuits, referred to herein as isolation circuits, that can be designed into ASIC chips such that the isolation circuits are transparent during normal operation of a host chip, but allow embedded functional blocks to be readily isolated and accessed for testing via the host chip's pads.

BRIEF DESCRIPTION OF THE DRAWINGS

The present invention can be further understood by reference to the following description and attached drawings which illustrate the preferred embodiment. It should be noted that like reference numbers indicate like elements in the various figures. In the drawings:

FIG. 1 is a schematic diagram of a control circuit for use in a system according to the present invention;

FIG. 2 is a simplified schematic diagram of one particular embodiment of the control circuit of FIG. 1;

FIG. 3 is a block diagram of a multiplexer circuit for providing a single test signal to a functional block in a host chip;

FIG. 4A is a block diagram of a multiplexer circuit for multiplexing two test signals with a system signal in a host chip;

FIG. 4B is a block diagram of a multiplexer-like circuit for multiplexing three or more test signals with a system signal in a host chip;

FIG. 5 is a block diagram of a multiplexer circuit for connecting a unidirectional input port of an isolated block to an input pad in a host chip;

FIG. 6 is a block diagram of a multiplexer circuit for connecting an input port of an isolated functional block to a bidirectional pad of a host chip;

FIG. 7 is a block diagram of a multiplexer circuit for connecting an output port of an isolated functional block to an output or bidirectional pad of a host chip;

FIG. 8 is a block diagram of a multiplexer circuit for connecting a bidirectional port of an isolated functional block to a bidirectional pad of a host chip;

FIG. 9A is a block diagram showing various functional blocks with a host chip;

FIG. 9B is a block diagram showing the functional blocks of FIG. 9A commonly connected to a bidirectional port of the host chip;

FIG. 10A is a block diagram showing a unidirectional input pad connected to a functional block;

FIG. 10B is a block diagram showing the functional block of FIG. 10A connected to a bidirectional pad;

FIG. 11A is a block diagram showing a unidirectional output pad connected to a functional block; and FIG. 11B is a block diagram showing the functional block of FIG. 11A connected to a bidirectional pad.

DETAILED DESCRIPTION OF THE PREFERRED EMBODIMENT

FIG. 1 shows a control circuit 10 which is to be embedded in a host ASIC chip of the LSI or VLSI class for use in isolating and testing functional blocks in the chip. The functional blocks, as mentioned previously, may comprise one or more random access memories (RAMs), read-only memories (ROMs), state machines, or programmable logic array (PLAs).

Generally speaking, control circuit 10 operates to provide binary logic values for use in controlling selected multiplexers which have been embedded in the host chip. As will be described below, the multiplexers are used to provide paths between the pads of the host chip and the ports of the functional blocks within the chip. In its illustrated embodiment, control circuit 10 is comprised of binary logic elements for controlling multiplexers that isolate as many as seven functional blocks within a host chip.

In practice, any test circuitry embedded in an ASIC chip should be unnoticeable, or "transparent", during normal operation of the chip. In that regard, a path between a pad and a port of functional block within the host chip can be transparent only if the path passes through combinational logic. Also, a functional block can be satisfactorily isolated within a host chip only if all of its ports are connected to chip pads by transparent paths.

In the embodiment illustrated in FIG. 1, control circuit 10 includes a decoder 13, an array of instance counters 17A, 17B and 17C, a counter enable device 19, and a counter reset device 21 (i.e., a NAND gate). In the preferred embodiment, counter enable device 19 is a D-type flip-flop or "latch". Further in control circuit 10, a clock pad 23 is connected to the clock inputs of counters 17A–17C and latch 19. It should be understood that a conventional binary logic clock is connected to clock pad 23. The respective output lines from counters 17A, 17B and 17C are labelled Cnt[0], Cnt[1] and Cnt[2] in the drawing. Those "count" lines are connected for driving decoder 13 and are available for connection to multiplexers in the isolation circuits that will be described below.

When decoder 13 has three binary count lines, as shown in FIG. 1, the count information can be uniquely represented on as many as eight output lines (i.e., $2^3=8$). In the drawing, those eight output lines are labelled N[0] through N[7]. As will be described below, the signals on lines N[1] through N[7] operate to select the functional block, or "instance" which is to be isolated within the host chip. Because of their function, lines N[1] through N[7] are sometimes referred to herein instance select lines. Preferably, all of the outputs on those lines are active low. It can be noted that the required size of decoder 13 reflects the number of functional blocks requiring isolation within the host chip.

Still further, control circuit 10 in FIG. 1 includes three test mode vector receiving lines TM[1], TM[2] and TM[3]. Those three lines are all connected to an AND gate 25 (TM[2] via an inverter) whose output is latched by latch 19. In turn, the output of latch 19 is connected to enable the counter 17A. Generally, as many lines as needed can be used to receive test mode vectors.

Control circuit 10 in FIG. 1 also includes reset circuitry operated from reset mode pads RM[1], RM[2] and RM[3] that are commonly connected to an AND gate 29 (RM[2] via an inverter). The output of AND gate 29 is applied, via an inverter 32, to the reset inputs of latches 19 and 27 and to AND gate 33. Also, the output of AND gate 29 is provided to NAND gate 21. It will be noted that instance select lines N[1] through N[7] also are connected to NAND gate 21. In turn, the output of NAND gate 21 is connected to the reset inputs of counters 17A through 17C.

The operation of the above-described elements of control circuit 10 of FIG. 1 will now be described.

When the host chip is not in a test mode, control circuit 10 deactivates all the transparent paths within the chip, leaving it free to behave exactly as if the testing logic were not present. However, when the host chip is in the test mode, control circuit 10 operates the embedded multiplexers to isolate selected ones of the functional blocks for testing. For example, in the illustrated embodiment, the output line N[1] from control circuit 10 is used to isolate a first functional block (i.e., instance), the output line N[2] is used to isolate a second functional block, and so forth for up to seven functional blocks. (The output line N[0] designates system mode, in which all the transparent paths are deactivated, as opposed to test mode in which different ones of the output lines N[1]–N[7] are used to isolated different functional blocks.)

Further in operation of control circuit 10 of FIG. 1, counter 17A is enabled by a test mode vector applied to lines TM[1]–TM[3]. In turn, counter 17A enables counters 17B and 17C. The test mode vector is, in practice, chosen so that it does not appear during normal operation of the host chip. Whenever counter 17A is enabled, the instance select lines N[1]–N[7] are all disabled via outputs from latch 19 and logic circuitry such as that comprised of latch 27, NOR gate 31, AND gate 33 with its associated inverter, and parallel OR gates 28A–28G. The purpose of disabling lines N[1]–N[7] during such times is to prevent spurious transitions by the isolation multiplexers. It may be noted that OR gates 28A–28G inactivate the instance select lines N[7] through N[1], respectively, until one cycle after counter 17A stops counting. It may also be noted that decoder 13 is connected such that it becomes inactive on the leading edge of a clock signal on the same cycle that the counter enable becomes active, and becomes active on the trailing edge of a clock signal on the cycle following the cycle that counter 17A becomes inactive.

Further in operation of control circuit 10 of FIG. 1, counter 17A is reset by a reset mode vector applied to lines RM[1]–RM[3] which feed into NAND gate 21. Normally, the reset mode vector is chosen to be a signal that always occurs when the host chip is powered up or reset for normal operation. It should be noted that an input from AND gate 29 is necessary for NAND gate 21 to produce an active high reset signal and, therefore, counters 17A–17C do not reset until after the host chip is in its normal operating mode. Accordingly, counter 17A is reset whenever the host chip is powered up and is enabled and clocked on the leading edge of the clock pulse. Also, a reset signal from AND gate 29 resets latches 19 and 27, and disables decoder 13 via AND gate 33 and OR gates 28A–28G.

Operation of control circuit 10 of FIG. 1 can now be summarized. That is, control circuit 10 provides logic value signals to isolate a functional block $B_N$ (where "N" is the identifier of a selected functional block embedded within the host chip) when binary signals are applied to the appropriate pads of the host chip to execute the following sequence of steps:

1. Disable counter 17A.
2. Reset counter 17A.
3. Start the clock.
4. Enable counter 17A.
5. Wait N clock cycles.
6. Disable counter 17A.
7. Wait an additional cycle for the instance enable to become stable.

FIG. 2 shows a simplified control circuit for use when only a single functional block is to be isolated within a host chip. In this embodiment, the control circuit comprises a single-bit counter 41 and a pair of AND gates 42 and 44. The input and output signals from the control circuit have the same functions as in the control circuit of FIG. 1.

As mentioned above, the transparent paths between functional block ports and chip pads during the test mode are provided by multiplexers. The multiplexer circuits will now be described. As will become apparent in the following, certain of the multiplexers can have as many as N input ports.

FIG. 3 shows a circuit for substituting a single test signal for a "system signal" when only a single functional block $B_l$ is to be isolated within a host chip. In FIG. 3, a multiplexer 51 is interposed between a selected chip pad $P_x$ and circuitry $C_x$ that ordinarily provides system signals to the chip pad. More particularly, the output of multiplexer 51 is connected to chip pad $P_x$, the first of the two inputs of multiplexer 51 is connected to circuitry Cx, the second of the two inputs is connected to the isolated block $B_1$, and the select input of the multiplexer is connected to receive the signal on instance select line N[1]. For purposes of discussion, the line carrying the output test signal from block $B_1$ is labelled TS[1].

In operation of the circuit of FIG. 3, the select signal on line N[1] is ordinarily kept high (i.e., at logic level "1") but is driven low when functional block $B_1$ is to be isolated for testing. Thus, ordinarily, signals pass unimpeded from circuitry $C_x$ to pad $P_x$. However, when the signal on line N[1] goes low (i.e., to logic level "0"), the signals from circuitry $C_x$ are blocked from reaching chip pad $P_x$ and, instead, the signals on line TS[1] from functional block $B_1$ are directed to the chip pad. It should be noted that the delay introduced into the system signal path is only the time taken by the signal to propagate through multiplexer 51.

FIG. 4A shows an example of a circuit that can be employed when two functional blocks, for example blocks designated by the decimal numbers 2 and 63, are to be tested within a host chip, with each block providing a single test signal. In the illustrated example, the two functional blocks are connected to a two-input multiplexer 53 via respective test test signal lines Test Signal [2] and Test Signal [63]. The multiplexer 53 has a single select line connected to Cnt[0] which assumes different states depending on whether the instance counters contain a count of 2 or a count of 63. Further in the circuit, the output of the multiplexer 53 is connected to an input of a multiplexer 51, as is a system signal ordinarily connected to a particular system connection. The select input of the multiplexer 51 is determined, via AND gate 52, by instance select lines N[2] and N[63].

In operation of the circuit of FIG. 4A, the signals on the two instance select lines N[2] and N[63] for controlling multiplexer 51 are high except when one of the functional blocks $B_2$ and $B_{63}$ is to be tested. When one of the signals on select lines N[2] or N[63] goes low, the signal from the multiplexer 53 is directed to the original system connection in place of the system signal. Then, depending upon the state of the count line Cnt[0], the output of the multiplexer 53 will correspond to the signal on one of the test signal lines Test Signal [2] or Test Signal [63].

FIG. 4B shows an example of a circuit that can be employed when three (or more) functional blocks $B_j$, $B_k$, $B_l$ and are to be tested within a host chip, with each block providing a single test signal. In the illustrated example, the functional blocks are connected to a multi-input multiplexer-like circuit 53 via respective test signal lines TS[j], TS[k], and TS[l]. Multiplexer circuit 53 receives instance select lines N[j], N[k] and N[l]. Further in the circuit, the output of multiplexer circuit 53 is connected to the second input of multiplexer 51. It should be noted that multiplexer 51 is connected as previously shown except that its select input is determined, via AND gate 52, by instance select lines N[j], N[k], and N[l]. It should also be observed that the delay on the system path equals only the delay through multiplexer 51 and is independent of the number of test signal lines being multiplexed.

In operation of the circuit of FIG. 4B, the signals on all three of the instance select lines N[j], N[k], and N[l] for controlling multiplexer 51 are high except when one of the functional blocks $B_j$ through $B_l$ is to be tested. When one of the signals on select lines N[j], N[k], or N[l] goes low, the signal from multiplexer circuit 53 is directed to the original system connection in place of the System signals. Then, depending upon the state of the instance select lines N[j], N[k] and N[l], the output of multiplexer circuit 53 will correspond to the signal on one of the test signal lines TS[j], TS[k], or TS[l].

In practice, five basic types of connections can be used for providing a transparent path between the port of a functional block and a pad of a host chip: 1) input pad to unidirectional input port; 2) input port to bidirectional pad; 3) output port to unidirectional output pad; 4) output port to bidirectional pad; and 5) bidirectional port to bidirectional pad. Circuitry to provide each of those connections will now be described.

FIG. 5 shows a circuit to provide a transparent path between a unidirectional input port of a functional block $B_N$ and an input pad $P_j$. In the circuit shown, a 2-to-1 multiplexer 56 is interposed between the unidirectional pad and the port. One input of multiplexer 56 is connected to pad $P_j$ via a level shifter 55 and the other input is connected to the circuit $C_x$ which ordinarily provides system signals to the input port of functional block $B_N$. The select input of multiplexer 56 is connected to line N[N] where "N" is the number which has been assigned to identify the functional block $B_N$.

In operation of the circuit of FIG. 5, signals from circuitry $C_x$ ordinarily are directed to the input port of functional block $B_N$. However, when functional block $B_N$ is to be isolated for testing, the binary state of line N[N] changes and, therefore, multiplexer 56 directs signals (i.e., test vector signals) from pad $P_j$ to the functional block. It may be observed that the signal on input pad $P_j$ is undisturbed electrically except for the additional capacitance of multiplexer 56.

FIG. 6 shows a circuit to provide a transparent path between an input port of a functional block $B_N$ and a bidirectional pad $P_k$ of a host chip. It should be noted that bidirectional pad $P_k$ includes buffers 55 and 57, and a pad driver 58 of conventional design. The connections in the circuit of FIG. 6 are similar to the ones in FIG. 5 except that circuitry is provided to disable pad driver 58 when pad $P_k$ is needed for sending test signals to functional block $B_N$.

In the circuit of FIG. 6, disablement of pad driver 58 is accomplished by a multiplexer 59 which multiplexes the enable line (OEB) of pad driver 58 with VSS if the enable signal is active high or VDD if the enable signal is active low. The select signal for multiplexer 59 is connected to select line N[N] where, again, "N" is the number that identifies the functional block, $B_N$, which is to be isolated for testing.

The operation of the circuit of FIG. 6 is the same as the operation of the circuit of FIG. 5 except for the disablement circuitry for pad driver 58. Thus, in ordinary operation of the host chip, signals are directed from circuitry $C_x$ to the input port of functional block $B_N$. Also in the non-test mode of operation, signals are directed from circuitry $C_y$ to pad $P_k$ depending upon the state of pad driver 58 as determined by circuitry $C_z$. In the test mode, however, signals from circuitry $C_z$ are blocked from passing through multiplexer 59 by the high input on select line N[N]. In turn, the VDD signal disables pad driver 58 and restricts bidirectional pad $P_k$ to operating as a unidirectional input pad. When pad $P_k$ operates as an input pad, passage of the test signal from pad $P_k$ to functional block $B_N$ is controlled by multiplexer 56 as described in connection with FIG. 5.

FIG. 7 shows a multiplexing circuit for connecting on output port of functional block $B_N$ to bidirectional pad $P_k$. In the circuit, a multiplexer 61 is provided for multiplexing the system signal to pad driver 58 from circuitry $C_w$ and the output signal from functional block $B_N$. Also, multiplexer 59 is provided for multiplexing the enable line for pad driver 58 in the same manner as shown in FIG. 6. It should be noted that select line N[N] is connected to the select inputs of both multiplexers 59 and 61.

In the test mode of operation of the circuit of FIG. 7, a low logic signal on line N[N] causes multiplexer 59 to block signals from circuitry $C_z$ from reaching the enable input of pad driver 58. Instead, the pad driver is enabled by the VSS signal, thereby causing bidirectional pad $P_k$ to operate as unidirectional output pad. (When pad $P_k$ operates as an output pad, system signals cannot be directed from the pad to circuitry $C_v$.) Also during the test mode, multiplexer 61 prevents signals from circuitry $C_w$ from reaching pad $P_k$; instead, because of the low logic signal on line N[N], the output signals from functional block $B_N$ are directed to pad $P_k$.

Further with regard to FIG. 7, it should be noted that multiplexer 59 would be unnecessary if pad $P_k$ were an output pad rather than a bidirectional pad. In that case, pad driver 58 would be absent and the Z output of multiplexer 61 would be connected directly to pad $P_k$.

The circuit of FIG. 7 can be generalized to the case where three or more functional blocks are present, each of which has an output port for connection to a single bidirectional pad of the host chip. In that case, a circuit such as the one shown in FIG. 4B is used to multiplex the output signals from the functional blocks. Also in that case, the instance select lines would be connected to an AND gate which, in turn, would be connected to the select inputs of multiplexers 59 and 61. Thus, pad driver 58 would be enabled concurrently with a test signal output from any one of the functional blocks that are under test.

FIG. 8 shows circuitry for providing a transparent path between a bidirectional port of a functional block $B_N$ and a bidirectional pad $P_k$. It should be noted that block $B_N$ includes a control port that indicates whether its bidirectional port is in the input or output mode. It should also be noted that two paths must be created to pad $P_k$ from the bidirectional port of block $B_N$ (i.e., one path for input signals to the block and one for output signals). In the example shown, multiplexer 61 is provided for multiplexing the system signal from circuitry $C_w$ with the output signal from the bidirectional port of block $B_N$. Also, multiplexer 59 is interposed between circuitry $C_z$ and the enable (OEB) input of pad driver 58. More particularly, multiplexer 59 is connected for multiplexing the enable signal to pad driver 58 with the signal from the control port of functional block $B_N$. It should be noted that instance select line N[N] is connected to the select inputs of both multiplexers 59 and 61.

As also shown in FIG. 8, a bidirectional control unit 73 is interposed in the input path from pad $P_k$ to block $B_N$. In the illustrated embodiment, control unit 73 comprises a multiplexer-like circuit 76 composed of three-state buffers, and an AND gate 77. The AND gate 77 is connected to the instance line N[N] of the functional block $B_N$ and may be connected to the instance select lines N[I] of other functional blocks to be connected to the pad $P_k$. When any of the instance select lines N[N] and N[I] is active, the corresponding three-state buffer is enabled, causing the CONTROL signal of the corresponding functional block to either enable or disable the input driver 83 as appropriate. When none of the instance select lines is active the output signal of AND gate 77 causes an additional three-state buffer 76a to disable the input driver 83. In operation of the circuit of FIG. 8, control unit 73 disables the path between the input level shifter 55 and the bidirectional port of functional block $B_N$ if the bidirectional port is in the output mode.

More particularly, when multiple functional blocks each have a bidirectional port that drives the same signal and when all of those ports are connected to a single bidirectional pad $P_k$ for testing. The inputs of the multiplexer circuit 76 are connected to receive instance select lines corresponding to each of the functional blocks that share the same bidirectional signal and that are being connected to the same pad. Further in that case, AND gate 77 also would receive the same instance select lines. Still further in the case of multiple functional blocks, the inputs of the multiplexer circuit 76 are connected to the control ports of those other functional blocks.

Also for employing the circuitry of FIG. 8 for the case where bidirectional ports from multiple functional blocks are to be connected to a single bidirectional pad, a control unit (e.g., unit 73) is added for each group of functional block ports that share the same bidirectional signal and that are mapped to the same bidirectional pad of the host chip. And, as mentioned above, the inputs to each multiplexer circuit in each control circuit would include lines from the control ports of all the functional block bidirectional ports that share the same signal and that are to be connected to the bidirectional pad under consideration.

It can now be understood that the above-discussed circuits for connection functional block ports to bidirectional pads can be combined. Accordingly, each bidirectional pad of a host chip can have some combination of input, output and bidirectional ports connected to it. An example of such a combination will be provided in conjunction with FIGS. 9A and 9B. FIG. 9A should be understood as showing functional blocks $B_1$ through $B_6$ within a host chip having a bidirectional pad $P_k$. FIG. 9B shows a multiplexer circuit which connects functional blocks $B_1$–$B_6$ to pad $P_k$ for sequential testing. It will be noted that the circuit of FIG. 9B is a combination of the various isolation circuits discussed above, including control units 73.

To determine which pad of a host chip should be used to provide an isolation path for testing any one functional block, the following priority method can be employed:

1. For a bidirectional connector on the functional block, choose a pad that has another instance connector connected to the same bidirectional signal mapped to it. (That is, try to map all connectors connected to the same bidirectional signal to the same pad.)
2. Choose a pad of the same type as an instance connector which already has a signal path added to it.
3. Choose a pad of the same type as the instance connector which does not already have a signal path added to it.
4. Choose a pad of any type which already has a signal path added it. (Such a pad will be changed to a bidirectional pad.)
5. Choose a pad of any type and, then, change the pad to a bidirectional pad if necessary.

Thus, in practice, it is preferred to use chip pads that already have isolation multiplexers added to them. The reason for this is that, once a pad has been disturbed with a multiplexer unit, no additional path delay is incurred by adding more test circuit signals to the pad if the above-described isolation circuits are used.

In accordance with the preceding priority method, situations may arise where a host chip has one or more unidirectional input or output pads which must be replaced with bidirectional pads. In practice, the automatic test circuit generation system includes a file with a list of unidirectional pad macro names and a corresponding list of their bidirectional equivalents to provide bidirectional equivalents for the unidirectional pad. Convenient steps for replacing a unidirectional pad with a bidirectional pad are as follows:

1. Disconnect all signal lines from the unidirectional pad which is to be replaced. The disconnected lines can include ones for the pad signal, an input signal or an output signal, and an optional output enable signal.
2. Delete the pad.
3. Add an equivalent bidirectional pad.
4. Reconnect all disconnected signals.
5. For input pads, add a three-state pad driver whose output enable is active low. Connect the output signal to VSS and connect the output enable to VDD to permanently disable it. (The replacement pad, unless modified further, will behave exactly like the original input pad.)
6. For output pads, replace the pad driver with a three-state pad driver with an output enable which is active low. Also, connect the output enable port of the pad driver to $V_{SS}$ to permanently enable it.

The method for replacing an input pad $P_I$ with a bidirectional pad $P_k$ is illustrated by FIGS. 10A and 10B. FIG. 10A shows the connections between pad $P_I$ and block $B_N$ before the pad is replaced with a bidirectional pad. FIG. 10B shows the configuration of the circuit after input pad $P_I$ has been replaced by bidirectional pad $P_k$.

Similarly, FIGS. 11A and 11B illustrate the method for replacing an output pad $P_o$ with a bidirectional pad $P_k$. FIG. 11A shows the connections between pad $P_o$ and block $B_N$ before the pad is replaced with a bidirectional pad. FIG. 11B shows the configuration of the circuit after output pad $P_o$ has been replaced by a bidirectional pad $P_k$.

The foregoing has described the principles, preferred embodiments and modes of operation of the present invention. However, the present invention should not be construed as being limited to the particular embodiments disclosed, and the embodiments described herein are to be regarded as illustrative rather than restrictive. Variations and changes may be made in the illustrated embodiments without departing from the spirit of the present invention as defined by the following claims.

What is claimed is:

1. A method of sequentially testing a plurality of functional blocks having data ports within an integrated circuit having external circuit connectors using isolation circuits that are substantially transparent during normal operation of the integrated circuit, comprising the steps of:
   a) assigning designations to the functional blocks to be tested;
   b) selecting the external circuit connectors of the integrated circuit to which respective ports of each of the functional blocks to be tested are to be connected for testing;
   c) for each selected external connector, embedding a first multiplexer in the integrated circuit for multiplexing system signals in the integrated circuit with test signals associated with testing the functional blocks, said first multiplexer having a select port;
   d) controlling the select port of the first multiplexer with a signal which identifies whether or not the integrated circuit is in a test mode;
   e) for each selected pad and each set of two or more functional blocks that are to be connected to the pad for testing, embedding in the integrated circuit a second multiplexer circuit having a select port and an output port, with the output of the second multiplexer circuit connected to the first multiplexer; and
   f) simultaneous with step d), controlling the select port of the second multiplexer circuit with a signal which uniquely identifies the functional block to be tested;
   whereby each functional block, when identified as the functional block to be tested, is connected through said first and second multiplexers directly to a selected external circuit connector.

* * * * *